(12) United States Patent
Janzén et al.

(10) Patent No.: US 10,199,222 B2
(45) Date of Patent: Feb. 5, 2019

(54) SEMICONDUCTOR DEVICE STRUCTURE AND METHODS OF ITS PRODUCTION

(71) Applicants: SWEGAN AB, Linköping (SE); Ole Bokinge

(72) Inventors: Erik Janzén, Linköping (SE); Jr-Tai Chen, Vikingstad (SE)

(73) Assignee: SWEGAN AB, Linkoping (SE)

(*) Notice: Subject to any disclaimer, the term of this patent is extended or adjusted under 35 U.S.C. 154(b) by 0 days.

(21) Appl. No.: 15/542,419

(22) PCT Filed: Jan. 9, 2015

(86) PCT No.: PCT/EP2015/050353
§ 371 (c)(1),
(2) Date: Jul. 8, 2017

(87) PCT Pub. No.: WO2016/110332
PCT Pub. Date: Jul. 14, 2016

(65) Prior Publication Data
US 2017/0365469 A1    Dec. 21, 2017

(51) Int. Cl.
H01L 21/02      (2006.01)
H01L 29/20      (2006.01)
H01L 29/205     (2006.01)
H01L 29/66      (2006.01)
H01L 29/778     (2006.01)

(52) U.S. Cl.
CPC .... H01L 21/02694 (2013.01); H01L 21/0254 (2013.01); H01L 21/0262 (2013.01);
(Continued)

(58) Field of Classification Search
CPC ............. H01L 21/0262; H01L 21/0254; H01L 21/02458; H01L 21/02378;
(Continued)

(56) References Cited

U.S. PATENT DOCUMENTS 7,777,217 B2 *   8/2010   Preble ................... C30B 25/02
                                                            257/189
2007/0141823 A1   6/2007   Preble et al.
(Continued)

OTHER PUBLICATIONS

Nakajima, A., et al., "Step Control of Vicinal 6H-SiC(0001) Surface by H2 Etching", Journal of Applied Physics, May 13, 2005, pp. 104919-1-104919-5, vol. 97.
(Continued)

Primary Examiner — Yosef Gebreyesus
(74) Attorney, Agent, or Firm — Hultquist, PLLC; Steven J. Hultquist

(57) ABSTRACT

The present document discloses a semiconductor device structure (1) comprising a SiC substrate (11), an $In_{x1}Al_{y1}Ga_{1-x1-y1}N$ buffer layer (13), wherein x1=0-1, y1=0-1 and x1+y1=1, and an $In_{x2}Al_{y2}Ga_{1-x2-y2}N$ nucleation layer (12), wherein x2=0-1, y2=0-1 and x2+y2=1, sandwiched between the SiC substrate (11) and the buffer layer (13). The buffer layer (13) presents a rocking curve with a (102) peak having a FWHM below 250 arcsec, and the nucleation layer (12) presents a rocking curve with a (105) peak having a FWHM below 200 arcsec, as determined by X-ray Diffraction (XRD).
Methods of making such a semiconductor device structure are disclosed.

16 Claims, 7 Drawing Sheets

(52) U.S. Cl.
CPC .. *H01L 21/02378* (2013.01); *H01L 21/02458* (2013.01); *H01L 21/02631* (2013.01); *H01L 21/02661* (2013.01); *H01L 29/2003* (2013.01); *H01L 29/205* (2013.01); *H01L 29/66462* (2013.01); *H01L 29/7787* (2013.01); *H01L 29/778* (2013.01)

(58) Field of Classification Search
CPC ........... H01L 21/02694; H01L 29/2003; H01L 29/205; H01L 29/66462; H01L 29/7787
See application file for complete search history.

(56) References Cited

U.S. PATENT DOCUMENTS

2009/0189192 A1* 7/2009 Lieten ..................... C30B 23/02
257/200

2010/0032716 A1* 2/2010 Sato .................. H01L 29/66462
257/192
2014/0346441 A1* 11/2014 Shur ....................... H01L 33/18
257/15
2015/0076507 A1* 3/2015 Hertkorn ............. H01L 21/0254
257/76

OTHER PUBLICATIONS

Nakajima, A., et al., "Growth of High-Quality AlN With Low Pit Density on SiC Substrates", Journal of Crystal Growth, Feb. 10, 2004, pp. 351-356, vol. 265.

Qu, S., et al., "Influence of the Growth Temperature of AlN Buffer on the Quality and Stress of GaN Films Grown on 6H-SiC Substrate by MOVPE", Journal of Alloys and Compounds, May 4, 2010, pp. 417-422, vol. 502.

Soubatch, S., et al., "Structure and Morphology of 4H-SiC Wafter Surfaces After H2-Etching", Materials Science Forum, May 15, 2005, pp. 761-764, vol. 483-485.

* cited by examiner

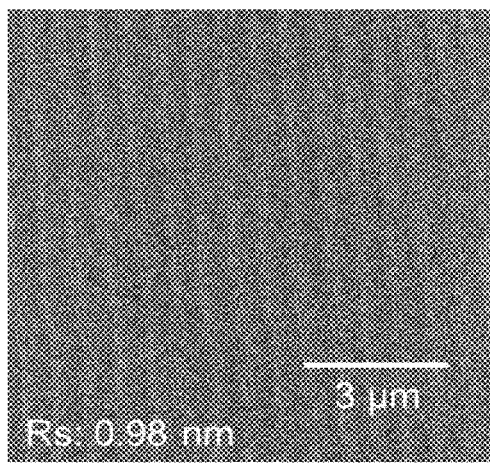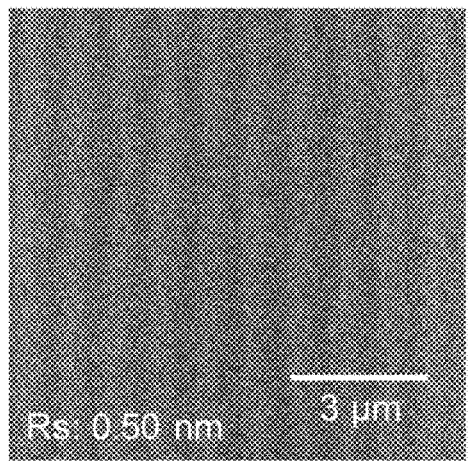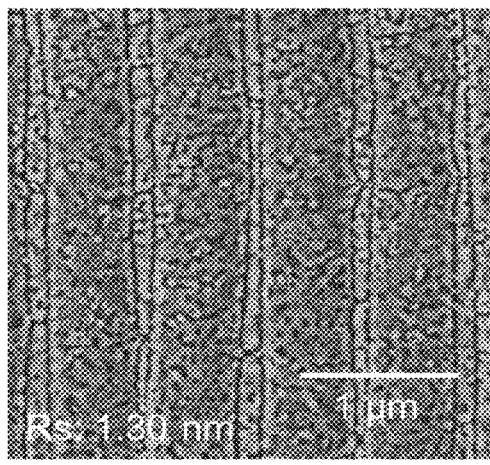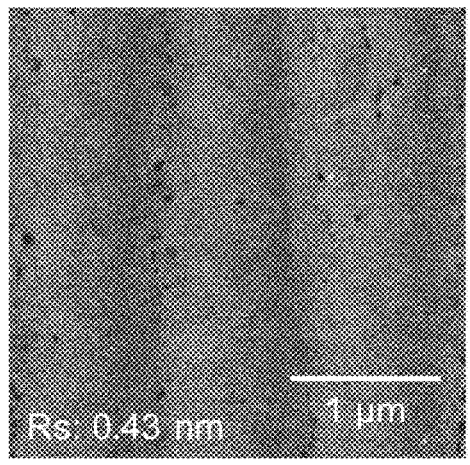
Fig. 6a  Fig. 6b

SEMICONDUCTOR DEVICE STRUCTURE AND METHODS OF ITS PRODUCTION

CROSS-REFERENCE TO RELATED APPLICATION

This application is a U.S. national phase under the provisions of 35 U.S.C. § 371 of International Patent Application No. PCT/EP2015/050353 filed Jan. 9, 2015. The disclosure of such international patent application is hereby incorporated herein by reference in its entirety, for all purposes.

TECHNICAL FIELD

The present disclosure relates to a semiconductor device structure for semiconductor devices and to methods for producing the same.

BACKGROUND

Materials based on indium aluminum gallium nitride ($In_xAl_yGa_{1-x-y}N$, x=0-1, y=0-1 and x+y=1), for example gallium nitride (GaN), are of great interest for use in semiconductor devices such as, but not limited to, high electron mobility transistors (HEMTs) due to excellent high frequency and power handling capabilities.

High thermal conductivity substrates, typically silicon carbide (SiC), are used in such devices in order to efficiently extract the heat and to minimize temperature rise of the device. In order to achieve high-quality heteroepitaxial growth of $In_xAl_yGa_{1-x-y}N$ on SiC, interfacial layers of the $In_xAl_yGa_{1-x-y}N$ type, x=0-1, y=0-1 and x+y=1, may be introduced between the $In_xAl_yGa_{1-x-y}N$ layer and the SiC substrate, and typically an aluminum nitride (AlN) nucleation layer is used to wet SiC substrate surface for two-dimensional nucleation process and to compensate for the lattice mismatch.

In order to use these materials in such applications, a high crystallinity of the $In_xAl_yGa_{1-x-y}N$ and AlN layers is of high importance.

Efforts to improve the crystal quality of an AlN nucleation layer sandwiched between a GaN buffer layer and a SiC substrate has been done and are discussed, e.g. by S. Qu and S. Li et al. in journal of Alloys and compounds 502 (2010) 417-422.

It is highly desirable to develop a semiconductor device structure with even further improved crystallinity of the constituting layers. Further, it is desirable to produce a semiconductor device structure with a reduced number of leakage current paths via structural defects like threading dislocations. Moreover, it is desirable to produce a semiconductor device structure with a reduced thermal boundary resistance (TBR).

SUMMARY

An object of the present disclosure is to provide an improved semiconductor structure, and in particular, a semiconductor structure that is improved in terms of one or more of the above mentioned properties.

The invention is defined by the appended independent claims, with embodiments being set forth in the appended dependent claims, in the following description and in the drawings.

According to a first aspect, there is provided a semiconductor device structure comprising a SiC substrate, an $In_{x1}Al_{y1}Ga_{1-x1-y1}N$ buffer layer, wherein x1=0-1, y1=0-1 and x1+y1=1, preferably x1<0.05 and y1<0.50, more preferably x1<0.03 and y1<0.30 and most preferably x1<0.01 and y1<0.10, and an $In_{x2}Al_{y2}Ga_{1-x2-y2}N$ nucleation layer, wherein x2=0-1, y2=0-1 and x2+y2=1, preferably x2<0.05 and y2>0.50, more preferably x2<0.03 and y2>0.70 and most preferably x2<0.01 and y2>0.90, sandwiched between the SiC substrate and the buffer layer. The buffer layer presents a rocking curve with a (102) peak having a FWHM below 250 arcsec, and the nucleation layer presents a rocking curve with a (105) peak having a FWHM below 200 arcsec, as determined by X-ray Diffraction (XRD).

A semiconductor device structure may be defined as stack of material layers which may be used for making a semiconductor device, or which may form part of a semiconductor device. An example of such a semiconductor device may be a high electron mobility transistor (HEMT).

The buffer layer is herein defined as the layer placed on top of, and preferably in direct contact with, the nucleation layer.

The nucleation layer may be defined as a layer for wetting the substrate surface and accommodating the lattice mismatch between a substrate and the buffer layer, enabling high quality buffer layer growth.

A rocking curve may be defined as a plot of the X-ray diffracted intensity versus the angle of the sample independently rotated (or "rocked") around the expected Bragg reflection.

A lower limit of the (102) peak FWHM of the buffer layer may be 100, 150 or 200 arcsec. The upper limit may be 200 or 250.

A lower limit of the (105) peak FWHM of the nucleation layer may be 50, 100 or 150. The upper limit may be 175 or 200.

x1 and x2 values may be the same or different. Likewise, y1 and y2 values may be the same or different.

In particular, x1 and x2 may be at the lower parts of the intervals indicated above, such as x1=x2<0.01 or even x1=X2=0. Preferably y2>y1. In one particular embodiment, x1=x2=0, y1=0 and y2=1.

The above semiconductor device structure provides enhanced crystallinity of the buffer layer and the nucleation layer as compared to what has been shown by prior art. Moreover, leakage currents may be reduced due to better crystalline quality in terms of a reduced threading dislocation density. Further, the semiconductor device structure may present a reduced thermal boundary resistance as compared with prior art semiconductor device structures.

The buffer layer may be GaN. Further examples of buffer layers are discussed in the detailed description.

The nucleation layer may be AlN. Further examples of nucleation layers are discussed in the detailed description.

The SiC polytype may be e.g. 4H, 6H, or 3C. By SiC polytype is meant the different structures SiC may exist in.

The surface of the SiC may have less than 5% oxygen monolayer, as determined by X-ray Photoelectron Spectroscopy.

By monolayer is meant a full surface coverage by an unit-cell-height material. Hence, "less than 5% oxygen monolayer" means that the surface coverage is not complete, and hence that less than 5% of the surface area is covered by oxygen.

The buffer layer may have a thickness of 1 to 4 μm, preferably 1.3 to 3 μm and most preferably 1.5 to 2 μm.

The nucleation layer may have a thickness of 10-100 nm, preferably 10-50 nm and most preferably 10-40 nm.

The morphology of the nucleation layer with thickness less than 100 nm may have 0 to 10 pits per $\mu m^2$, preferably 0 to 8 pits per $\mu m^2$, most preferably 0 to 5 pits per $\mu m^2$, due to an enhanced coalescence process By coalescence is meant the process by which two or more particles/islands merge during contact to form a single bigger particle/island or film.

"Pit per $\mu m^2$" may be defined as the number of holes or recesses per $\mu m^2$.

According to a second aspect, there is provided a high electron mobility transistor (HEMT) comprising a semiconductor structure as described above.

According to a third aspect, there is provided a semiconductor device formed from the semiconductor device structure.

According to a fourth aspect, there is provided a method of producing a semiconductor device structure, comprising: providing a SiC substrate, and providing an $In_{x2}Al_{y2}Ga_{1-x2-y2}N$ nucleation layer, wherein x2=0-1, y2=0-1 and x2+y2=1, preferably x2<0.05 and y2>0.50, more preferably x2<0.03 and y2>0.70 and most preferably x2<0.01 and y2>0.90, on the SiC substrate. The temperature upon growth of the nucleation layer is ramped up by 5-25° C./min, preferably by 7-20° C./min and most preferably by 10-15° C./min, for a time period of 2 min to 20 min.

The temperature may be measured from a hole located at the upstream side, the upper part (ceiling) of the susceptor by a pyrometer. The determination of the temperature value might be different depending on the techniques used and the location of the measurement.

"Ramped up" is defined as an increase of the temperature. Such increase may e.g. be stepwise or continuous, linear, progressive or degressive.

The use of temperature ramp up upon nucleation growth provides improved crystallinity of the nucleation layer.

According to a fifth aspect, there is provided a method of producing a semiconductor device structure, comprising: providing a SiC substrate, providing an $In_{x2}Al_{y2}Ga_{1-x2-y2}N$ nucleation layer, wherein x2=0-1, y2=0-1 and x2+y2=1, preferably x2<0.05 and y2>0.50, more preferably x2<0.03 and y2>0.70 and most preferably x2<0.01 and y2>0.90, on the SiC substrate, providing an $In_{x1}Al_{y1}Ga_{1-x1-y1}N$ buffer layer, wherein x1=0-1, y1=0-1 and x1+y1=1, preferably x1<0.05 and y1<0.50, more preferably x1<0.03 and y1<0.30 and most preferably x1<0.01 and y1<0.10, on the nucleation layer. The buffer layer presents a rocking curve with a (102) peak having a FWHM below 250 arcsec, and the nucleation layer presents a rocking curve with a (105) peak having a FWHM below 200 arcsec, as determined by X-ray Diffraction (XRD).

The substrate may be pretreated in situ or ex situ by an etching gas, such as $H_2$, HCl, HF, HBr or $SiF_4$, $Cl_2$, or a combination of these, such as $H_2$ and any one of the other.

By pretreatment of the substrate the amount of e.g. oxygen and carbon contamination onto the substrate surface may be reduced.

The pressure may be 100 mbar to 10 mbar, preferably 60 mbar to 10 mbar, and most preferably 30 mbar to 10 mbar upon pretreatment at a temperature of at least 1250° C.

The pressure may be 1000 mbar to 10 mbar, preferably 500 mbar to 10 mbar, most preferably 200 mbar to 10 mbar upon pretreatment at a temperature of at least 1400° C.

The etching gas, preferably $H_2$, may be provided at a flow rate of 20 to 30 l/min and/or HCl may be provided at a flow rate of 100 to 200 ml/min.

At least one of the nucleation layer and the buffer layer may be grown by Metal Organic Chemical Vapor Deposition (MOCVD) or Metal Organic Vapor Phase Epitaxy (MOVPE), Hydride Vapor Phase Epitaxy (HVPE), or Molecular Beam Epitaxy (MBE).

At least one of the precursors for nucleation growth by MOCVD or MOVPE, may be metal-organic, such as $Al_2(CH_3)_6$, and the other one may be $NH_3$.

A precursor may be defined as a source material and may be allowed to react with at least another precursor.

The precursors may be provided by at least one carrier gas, such as $H_2$, Ar or $N_2$ or a combination thereof.

A carrier gas may be used for transporting the at least one precursor, e.g. to a reactor.

The pressure upon growth of the nucleation layer may be 200 mbar to 10 mbar, preferably 100 mbar to 20 mbar, most preferably 60 mbar to 40 mbar for MOCVD or MOVPE.

The starting temperature upon growth of the nucleation layer may be 800° C. to 1150° C., preferably 900° C.-1100° C., most preferably 950° C.-1050° C. for MOCVD or MOVPE.

The growth rate of the nucleation layer may be 100 nm/h to 1000 nm/h, preferably 150 nm/h to 600 nm/h, most preferably 200 nm/h to 400 nm/h for MOCVD or MOVPE.

The pressure upon growth of the nucleation layer may be 200 mbar to 10 mbar, preferably 100 mbar to 20 mbar, most preferably 60 mbar to 40 mbar, for HVPE.

The starting temperature upon growth of the nucleation layer may be 800° C. to 1200° C., preferably 900° C. to 1150° C., most preferably 950° C. to 1100° C. for HVPE.

The growth rate of the nucleation layer may be 1 $\mu m/h$ to 100 $\mu m/h$, preferably 5 $\mu m/h$ to 50 $\mu m/h$, most preferably 10 $\mu m/h$ to 20 $\mu m/h$ for HVPE.

The pressure upon growth of the nucleation layer may be $1\times10^{-3}$ mbar to $1\times10^{-7}$ mbar, preferably $5\times10^{-3}$ mbar to $1\times10^{-6}$ mbar, most preferably $1\times10^{-4}$ mbar to $1\times10^{-5}$ mbar for MBE.

The starting temperature upon growth of the nucleation layer may be 500° C. to 1000° C. preferably 550° C. to 900° C., most preferably 600° C. to 800° C. for MBE.

The growth rate of the nucleation layer may be 100 nm/h to 1000 nm/h, preferably 200 nm/h to 800 nm/h, most preferably 400 nm/h to 600 nm/h for MBE.

DESCRIPTION OF THE DRAWINGS

FIGS. 6a and 6b show AFM pictures of an AlN surface produced according to prior art and according to the method disclosed herein, respectively.

DETAILED DESCRIPTION

The concept disclosed herein will now be explained in more detail. Initially the method for producing a semiconductor device structure is described, thereafter characterization results of the device structure are discussed.

Device Structure and Materials

Figure 1:
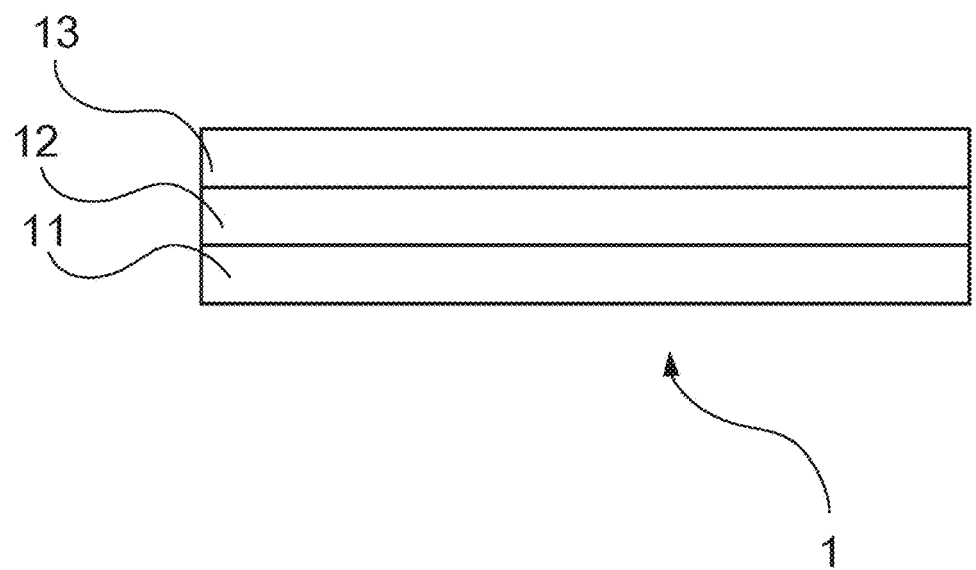
FIG. 1 schematically illustrates a semiconductor device structure.

FIG. 1 schematically illustrates a semiconductor device structure 1 with a nucleation layer 12 of indium aluminum gallium nitride ($In_{x2}Al_{y2}Ga_{1-x2-y2}N$, x2=0-1, y2=0-1 and x2+y2=1), sandwiched between a silicon carbide (SiC) substrate 11 and a buffer layer of $In_{x1}Al_{y1}Ga_{1-x1-y1}N$, x1=0-1, y1=0-1 and x1+y1=1, 13.

For the $In_{x2}Al_{y2}Ga_{1-x2-y2}N$ nucleation layer and the $In_{x1}Al_{y1}Ga_{1-x1-y1}N$ buffer layer the boundaries may be as set forth above. Hence, the nucleation layer and the buffer layer may be made of the same or different materials.

One purpose of the nucleation layer is to compensate for the lattice mismatch between the SiC substrate and the buffer layer, and to obtain high quality epitaxial growth of the buffer layer on SiC. Another purpose of the nucleation layer is to enable growth of e.g. GaN on it. GaN does not nucleate two-dimensionally on some substrates, such as SiC, so there may be a need for an AlN nucleation layer to change the surface potential, such that GaN can be grown. The nucleation layer may be added, directly on the SiC substrate, i.e. no additional layers may be placed between.

Typically nucleation layers produced according to prior art methods having a thickness of above 8-12 nm starts to relax due to a lattice mismatch of about 1% between the SiC substrate and the nucleation layer. A fully strained nucleation layer as shown herein may improve the crystalline quality of the buffer layer.

The nucleation layer grown by the method disclosed herein may be fully strained at a thickness of up to at least 100 nm. However, once the nucleation layer exceeds this thickness, the nucleation layer will start to relax due to lattice mismatch.

By fully strained is meant that the in-plane lattice constant of the nucleation layer is exactly the same, or exactly the same +/−0.15%, preferably +/−0.05% or +/−0.02%, as the in-plane lattice constant of the SiC substrate. Typically, if the nucleation layer is fully strained, its asymmetric X-ray reflex, like (105), would exhibit well-aligned with the SiC substrate's asymmetric X-ray reflex, like (1010), along the x axis in the reciprocal space map, like FIG. 5b.

The purpose of the buffer layer is to develop the structure quality by a thick layer growth and is supposed to be fully relaxed when the desired thickness is reached, in contrast to the nucleation layer which, if grown at a certain thickness by the method disclosed herein, may be fully strained as discussed, above.

As an example the nucleation layer 12 may be aluminum nitride (AlN) and the buffer layer 13 may be gallium nitride (GaN). Characterization results of such a SiC/AlN/GaN structure will be discussed in more detail in this disclosure.

The SiC substrate is used due to its high thermal conductivity properties in order to efficiently extract generated heat and to minimize temperature rise in a semiconductor device. The polytype of the SiC substrate may be for example 4H, 6H or 3C. The orientation of the SiC substrate may be represented by c-plane, a-plane and m-plane. For the c-plane there are two faces, Si face and C face, respectively. Upon production of the structures discussed in this disclosure either Si face or C face may be used. The substrate may preferably be an on-axis substrate. However as an alternative a low angle off cut substrate, such as below 2 degrees off, may be used.

Pretreatment of SiC Substrate

Before growth of the subsequent nucleation layer, buffer layer and optional additional layers, the SiC substrate is pretreated in order to remove surface contamination that mainly may be composed of oxygen but also of carbon.

Preferably the pretreatment may be performed in situ, i.e. in the same chamber/reactor as the growth of the nucleation, buffer and optionally additional layers will take place. As an alternative the pretreatment may be performed ex situ, for example in a furnace. Hence, in the latter case the substrate is moved after pretreatment to the reactor in which the layers are grown. Typically, if correctly performed, moving the substrate does not give rise to new surface contamination.

Before the in situ pretreatment, the SiC substrate may, but need not, be cleaned and optionally rinsed and further optionally purged. For example, the SiC substrate may be cleaned in acetone, methanol, and a solution of $NH_4OH+H_2O_2+H_2O$ (1:1:5) at 80° C., and $HCl+H_2O_2+H_2O$ (1:1:5) at 80° C., each solution for 5 min, and finished with deionized water rinsing and $N_2$ purging and clip in HF solution.

For pretreatment, gases providing an etching effect on the substrate, e.g. $H_2$, HCl, or a combination thereof, may be allowed to flow into the reactor and hence interact with the substrate. As an alternative HF, HBr or $SiF_4$, or a combination of any one of these and $H_2$, may be used.

As an example, the flow rate of $H_2$ may be about 20-30 l/min and/or the flow rate of HCl about 100-200 ml/min.

The temperature may be ramped up to a pretreatment temperature and then ramped down immediately without keeping at the maximum temperature.

Pressure and temperature of the reactor as well as time sufficient to provide an oxygen free SiC substrate as detected by XPS may be determined by routine experimentation.

The pressure in the reactor upon pretreatment may be in the range of atmospheric pressure to 10 mbar, preferably about 50 mbar. Before beginning of the pretreatment, the background pressure in the reactor may be below $1 \times 10^{-3}$ mbar. Preferable the background pressure should be as low as possible.

The reactor may be heated to about 1250-1500° C. by e.g. inductive or resistive heating for pretreatment at a pressure in the reactor of 50 mbar.

It may be noted that the pretreatment also is dependent on the pressure, i.e. if the pretreatment is performed at a lower temperature, the pressure may be lower in order to remove the surface contamination, mainly comprising oxygen but also carbon, as compared to if it is performed in a higher temperature where a wider range of pressures may be used in order to remove the same amount of contamination.

As an example, the SiC substrate may be pretreated by $H_2$ in 1250° C. at 50 mbar during a total pretreatment time (i.e. temperature ramp up and ramp down) of at least 30 min, which may result in a SiC substrate with less than 5% monolayer oxygen (i.e. less than 5% of the surface area is covered by oxygen) as detected by XPS.

Figure 2:
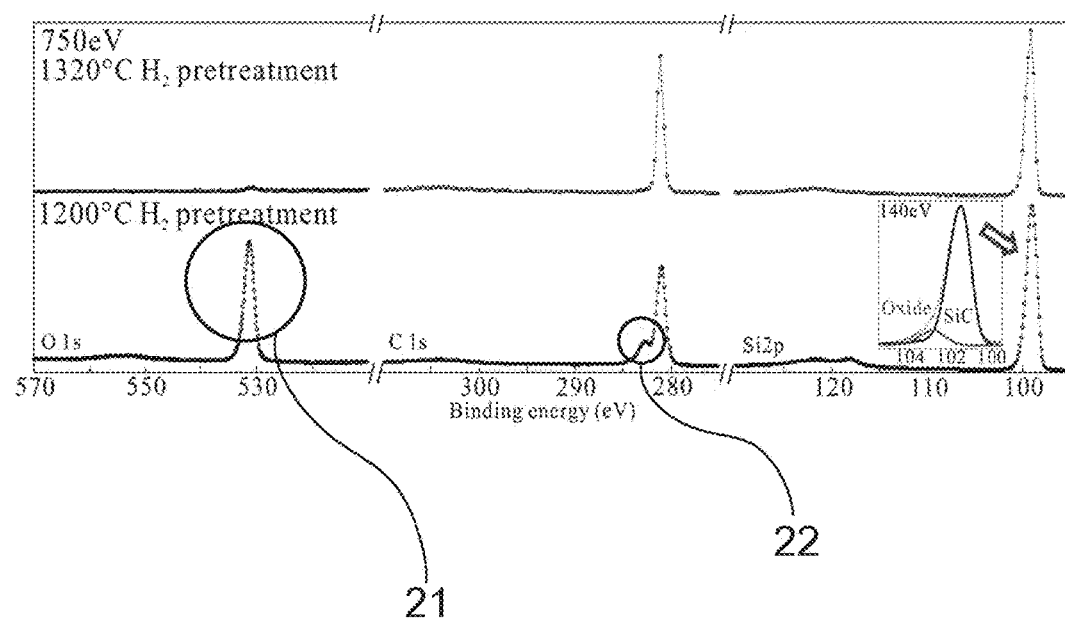
FIG. 2 shows XPS spectra of SiC substrates, pretreated by $H_2$ in a MOCVD reactor at 1200° C. and 1320° C., respectively.

In FIG. 2 X-ray Photoelectron Spectroscopy (XPS) spectra of SiC substrates pretreated in 50 mbar at 1200° C. (bottom spectrum) and 1320° C. (upper spectrum), respectively, are shown. Both spectra have peaks around binding energies 279 eV and 101 eV, originating from C1s and Si2p, respectively, i.e. from the SiC substrate.

In addition, the bottom spectrum (SiC substrate pretreated at 1200° C. in 50 mbar for 30 minutes) has a relatively large oxygen-related peak 21 at around 530 eV and a smaller feature 22 at the lower binding energy side of the C1s peak. Those features can be derived from oxygen and carbon surface contamination present for non-pretreated and not sufficiently pretreated substrates.

As can be seen in the upper spectrum, the substrate pretreated at 1320° C. substantially lacks both the oxygen-related peak and the higher binding energy carbon feature. Typically the level of oxygen may not be detectable by XPS for substrates pretreated at temperatures above 1250° C. according to the process described above.

The pretreatment process of the SiC substrate may be the same, regardless of the method, i.e. MOCVD, HVPE or MBE, which will be used for growing the AlN nucleation layer and the subsequent layers. However, if performing the pretreatment in a MBE reactor, in which the pressure is lower as compared to e.g. a MOCVD reactor, both the pressure and temperature may be lower upon pretreatment as discussed above.

Methods for Layer Growth

The $In_xAl_yGa_{1-x-y}N$ nucleation layer, e.g. $Al_yGa_{1-y}N$ or AlN, and the $In_xAl_yGa_{1-x-y}N$ buffer layer, e.g. $Al_yGa_{1-y}N$ or GaN, may be deposited by Metal Organic Chemical Vapor Deposition (MOCVD), which also is known as Metal Organic Vapor Phase Epitaxy (MOVPE). MOCVD, or MOVPE, is a chemical vapor deposition method in which a solid material is deposited onto a substrate by chemical reactions of vapor phase precursors. The method is mainly used for growing complex semiconductor multilayer structures.

In MOCVD, the precursors are metal-organic compounds, typically in combination with a hydride gas such as $NH_3$. Precursors used for the AlN nucleation growth may be trimethylaluminum (TMAl), i.e. $Al_2(CH_3)_6$, and ammonia, $NH_3$. As an example, the flow rate of the precursors may be 2 l/min for $NH_3$ and 0.7 ml/min for TMAl. The flow rate of the carrier gas flowing through the TMAl bubbler, e.g. $H_2$ may be 70 ml/min. The precursor flow merges with a main carrier gas flow, which may be on the order of 50 l/min for further transport to the reactor.

The precursors are transported, often by means of a carrier gas, into a reactor chamber in which at least one substrate is placed. Reactions of the precursors forming reactive intermediates and by-products take place on the substrate or in near vicinity of the substrate. The reactants are adsorbed on the substrate, forming, a thin film layer and finally by-products are transported away from the substrate.

The pressure in a MOCVD system upon thin film growth normally ranges from a few mbars up to atmospheric pressure.

The reactor chamber may be of either cold-wall or hot-wall type. In a cold-wall reactor the substrate is typically heated while the reactor walls are kept cooler than the substrate. In contrast, in a hot-wall reactor the entire reactor chamber is heated, i.e. both the substrate and the reactor.

For growth of the AlN and GaN layers discussed in this disclosure, a hot-wall VP508GFR, Axtron reactor was used. (Refs: Doping of Al-content AlGaN grown by MOCVD, PhD thesis, D. Nilsson, 2014 and Wikipedia).

Alternatives

As an alternative, the nucleation layer and the buffer layer may be grown by Hydride Vapor Phase Epitaxy (HVPE). Unlike MOCVD, the HVPE process does not involve metal-organic precursors, instead gaseous metal chlorides, e.g. $AlCl_3$ are allowed to react with $NH_3$ upon AlN nucleation growth. For HVPE the same reactor may be used upon preparation of the nucleation and buffer layers as for the MOCVD. The temperature and pressure upon growth may be the same as for growth by MOCVD. However, the growth rate of an AlN nucleation layer may be 50 to 100 times higher, i.e. about 100 µm/h, by HVPE. If increasing the temperatures of the precursors, the growth rate may be even faster.

As a further alternative, Molecular Beam Epitaxy (MBE) may be used for AlN nucleation and GaN buffer layer growth. In contrast to MOCVD, MBE is based on physical processes, and typically no chemical reactions are involved. Another difference is that the process takes place at lower pressure as compared to MOCVD and HVPE.

As an example, precursors used upon preparation of AlN layers may be plasma-$N_2$ and $Al_2(CH_3)_6$. The pressure may be in the range of $10^{-3}$ to $10^{-4}$ mbar resulting in a growth rate of below 1 µm/h, i.e. much lower than for MOCVD and HVPE.

Transition into AlN Nucleation Layer Growth and AlN Nucleation Layer Growth

The process steps will now be described with regard to MN nucleation layer grown by the MOCVD (MOVPE) method. Parameters for alternative methods, i.e. Hydride Vapor Phase Epitaxy (HVPE) and Molecular Beam Epitaxy (MBE) are discussed separately.

If the pretreatment is performed in situ, the flow of the pretreatment gases, e.g. HCl and/or $H_2$, may be kept upon transition to AlN nucleation layer growth. If the pretreatment is performed ex situ the pretreated SiC substrate is transferred to the reactor in which the AlN nucleation layer growth should take place. The transfer of the substrate may take place in ambient conditions, i.e. air. If the pretreatment takes place ex situ the temperature and pressure of the reactor may be set, when the SiC substrate has been transferred into the reactor chamber, in the same way as discussed below.

The temperature of the reactor may be lowered while the pressure in the reactor may be maintained. The lowering of the temperature may be performed in one step, i.e. the heating may be turned off or set at a lower temperature value.

When the temperature of the reactor is stabilized at about 800-1150° C., i.e. the so-called starting temperature for the AlN nucleation layer growth, the pressure may be increased as compared to the pressure used during the pretreatment.

The pressure may be controlled by the use of a valve, such as a throttle valve, which may be situated between the reactor and a pump, such as a roots pump, dry process vacuum pump, or screw pump. When e.g. partly closing the throttle valve, the pumping on the reactor chamber is decreased and hence the pressure may increase due to the continuous flow of $H_2$ and/or HCl.

Both the temperature and the pressure may be allowed to stabilize and after stabilization, if using HCl as pretreatment gas, the inlet of HCl to the reactor may be switched off (e.g. by closing a valve between the HCl source and the reactor). If using $H_2$ as pretreatment gas the flow may be maintained as it may be used as carrier gas for transportation of at least one of the precursors upon AlN nucleation layer growth.

The carrier gas may be an inert gas such as $H_2$ or $N_2$. $H_2$ or $N_2$ may be used for transportation of the precursors to the reactor and $H_2$ and $N_2$ are used as carrier gas in the growth zone of the reactor. Preferably the carrier gas(es) are allowed to flow and optionally let into the reactor before the precursors are allowed to flow into the reactor (e.g. by opening a valve between the respective precursor and the reactor).

The containers storing the precursors may be temperature controlled, and the precursors may preferably be kept at room temperature. As an alternative, at least one of the precursors may be heated, which may increase the vapor pressure of the heated precursor such that the growth rate of the layer may be increased. However, as a too high flow rates/growth rate may lead to poorer quality of the layers, heating is not always optimal.

At least one mass flow controller may be placed between each precursor container and the reactor in order to control the flow rate of each precursor into the reactor.

The precursors, e.g. Al$_2$(CH$_3$)$_6$, and NH$_3$, are then simultaneously transported in gaseous form by the carrier gas into the reactor, hence the AlN nucleation layer growth on the SiC substrate may begin.

During AlN nucleation layer growth the temperature inside the reactor is ramped up by a ramping rate of 5-25° C./min as measured inside the reactor for a time period of 2 min to 20 min. Under such conditions, 7 min growth may result in an AlN thickness of about 30-40 nm. The thickness of the AlN nucleation layer should preferably be below 100 nm in the semiconductor device structure disclosed herein.

The temperature ramping may be incremental in small steps of e.g. 1/100 to 1/2 of the ramp rate. In the alternative, the ramping may be continuously linear, progressive or degressive. Preferably the ramping is continuously linear.

For AlN nucleation layer growth by HVPE, the starting temperature of the reactor may be the same, as for MOCVD growth. Also the pressure upon growth may be the same for HVPE as for MOCVD.

For AlN nucleation layer growth by MBE, the starting temperature of the reactor may be in the range of 500-1000° C., i.e. lower as compared to growth by MOCVD and HVPE. The lower starting temperature may be due to lower pressure during growth using MBE.

GaN Buffer Layer Growth

Growth of a buffer layer onto a nucleation layer (e.g. the AlN nucleation layer described above) will now be described with regard to a GaN buffer layer grown by the MOCVD (or MOVPE) method. As an alternative, the buffer layer may be deposited by HVPE or MBE as well.

The buffer layer may preferably, but need not, be grown in the same reactor as the nucleation layer.

The precursors used for GaN buffer layer growth may be trimethyl gallium, TMG, Ga(CH$_3$)$_3$, and ammonia, NH$_3$. As an example, the flow rates of the precursors may be 2 l/min for NH$_3$ and 0.62 ml/min for TMGa. The flow rate of the carrier gas flowing through the TMGa bubbler, e.g. H$_2$, may be 42 ml/min. The precursors may be provided at room temperature. As an alternative at least one of the precursors may be heated in order to increase the flow rate and hence the growth rate of the GaN buffer layer.

The flow of each of the precursors may be controlled by at least one mass flow controller that may be situated between the precursor container and the reactor. Each or both of the precursors may be transported by a carrier gas, such as H$_2$, N$_2$ or Ar, into the reactor. The temperature of the reactor may be about 1050° C. upon growth of the GaN layer. The pressure in the reactor upon GaN growth may be about 50 mbar.

The growth of the GaN buffer layer may then be started when the temperature and pressure are stabilized. Under those conditions, the growth rate of the GaN layer may be about 700 to 2000 nm per hour. Preferably, the thickness of the GaN buffer layer may be about 1 to 4 µm in a SiC/AlN/GaN structure for e.g. a HEMT device.

Characterization of SiC/AlN/GaN

The interface of a SiC/AlN/GaN semiconductor device structure produced by the method disclosed herein, i.e. with pretreatment of the SiC substrate and ramp up of the starting temperature upon AlN growth, and the interface of a SiC/AlN/GaN reference semiconductor device structure produced according to a prior art method characterized by X-ray Diffraction (XRD). The structure according to the prior art method was produced without pretreatment of the SiC substrate and without temperature ramping upon AlN nucleation layer growth. The other parameters, such as temperature of the reactor and pressure upon growth, were the same for both AlN nucleation layer and GaN buffer layer growth. Both structures were produced by MOCVD and in the same reactor.

The thickness of the AlN nucleation layer grown according to the method disclosed herein was 38 nm and the thickness of the AlN nucleation layer grown according to the prior art method was 35 nm. The thickness of both the GaN buffer layer grown onto the AlN nucleation layer grown according to the method disclosed herein and the thickness of the GaN buffer layer grown onto a AlN nucleation layer grown according to prior art was 1.8 µm.

XRD measurements of different XRD planes like (002), (102), (103), (104), (105) for the same material lead to different peak width of the rocking curves. The (002) plane gives information of screw-type dislocations and the (102), (103), (104), (105) planes give information of edge- and mixed-type dislocations for different extent. The (105) plane usually gives more narrow peak width than the (102), (103), (104) planes.

A narrow rocking curve indicates a lower dislocation density and hence improved crystallinity as compared to a wide rocking curve. The thicker a layer is, the better the crystalline quality is, hence obtaining a narrower peak width for the material.

Figure 3A:
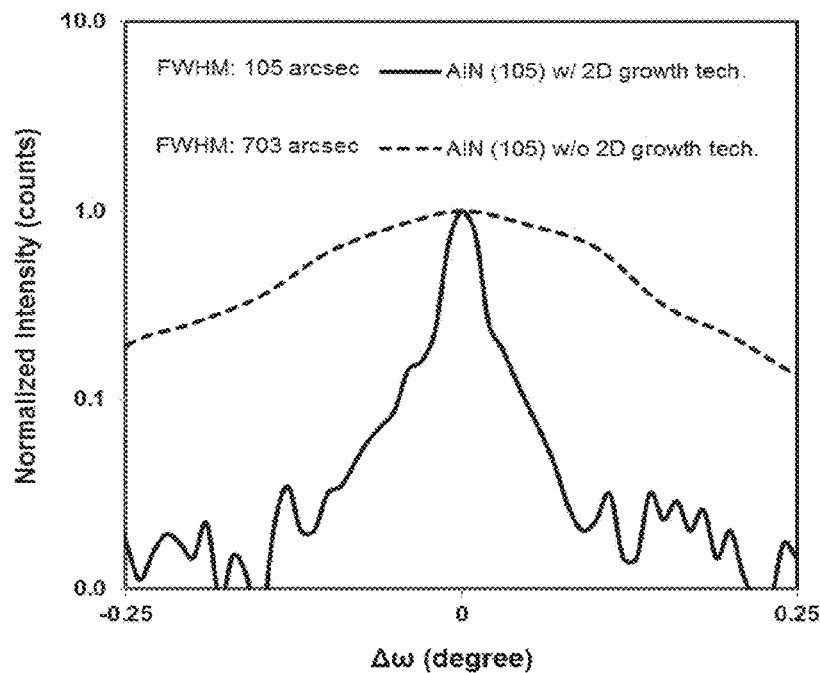
FIGS. 3a and 3b show rocking curves of AlN (105) and AlN (002) peaks, respectively, measured by XRD.

In FIG. 3a, the AlN nucleation layer grown according to the method disclosed herein presents a rocking curve with an AlN (105) peak having a Full Width Half Maximum (FWHM) of 105 arcsec. In comparison the reference AlN nucleation layer grown by the prior art method, has a wider rocking curve of the AlN (105) peak with a FWHM of 703 arcsec. Typically the FWHM for AlN (105) peaks are of 30-200 arcsec for AlN nucleation layers produced by the method disclosed herein.

Figure 3B:
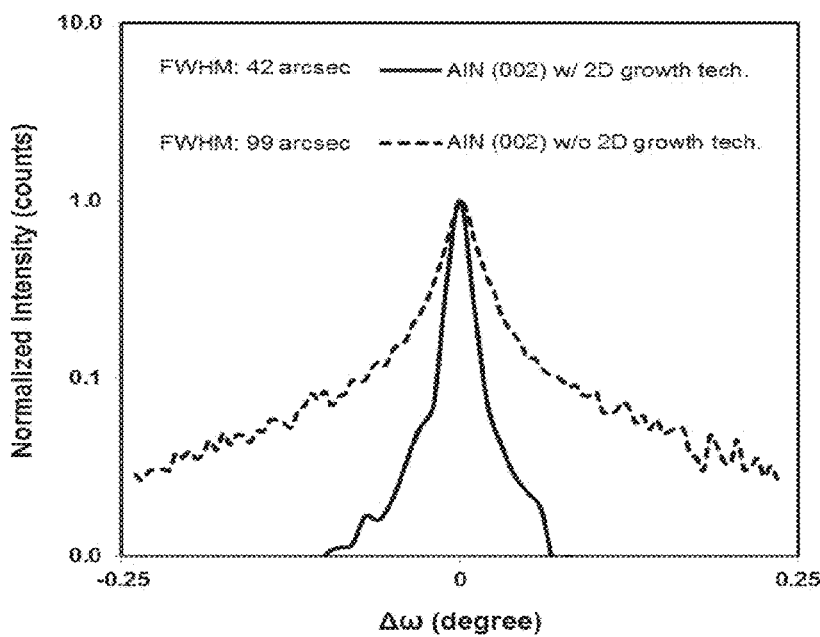

FIG. 3b shows rocking curves of the AlN (002) peak of AlN nucleation layers grown by the method disclosed herein using temperature ramp up and by the prior art method, respectively. The AlN (002) peak of the AlN nucleation layer grown by the present method has a FWHM of 42 arcsec while the AlN (002) peak of the reference AlN nucleation layer grown by the prior art method is wider and has a FWHM of 99 arcsec.

Hence, this indicates improved crystallinity of the AlN nucleation layer produced by the method disclosed herein as compared to AlN nucleation layers produced according to prior art.

The dislocation density of the AlN nucleation layer may be below $10^9$ per cm$^2$, and for the nucleation layer shown in FIG. 5b it is about $5 \times 10^8$ per cm$^2$, as measured by XRD. Typically, the impurity level may be less than $5 \times 10^{19}$ per cm$^3$ for AlN.

Figure 4A:
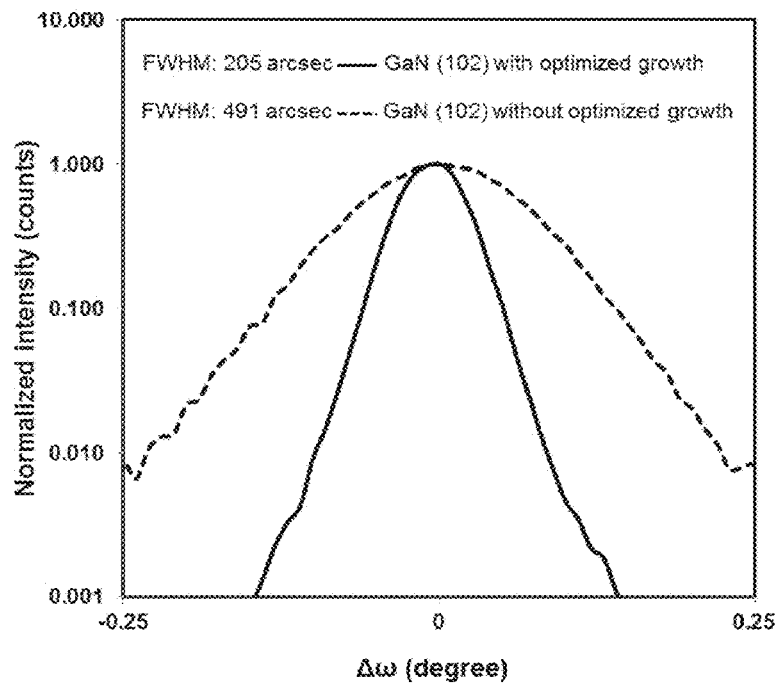
FIGS. 4a and 4b show rocking curves of GaN (102) and GaN (002) peaks, respectively, measured by XRD.

Rocking curves of the GaN (102) peak of a GaN buffer layer in a SiC/AlN/GaN device structure grown by the method disclosed herein and of reference GaN buffer layer in a SiC/AlN/GaN device structure grown by a prior art method, respectively, are shown in FIG. 4a. The reference GaN buffer layer has a GaN (102) peak with a FWHM of 491 arcsec while the corresponding peak of the GaN buffer layer grown by the method disclosed herein is narrower and has a FWHM of 205 arcsec indicating improved crystallinity as compared to the reference GaN buffer layer. Typically the rocking curve of the GaN (102) peak has a FWHM of 100-250 arcsec for GaN buffer layers in a SiC/AlN/GaN device structure grown by the method disclosed herein.

Figure 4B:
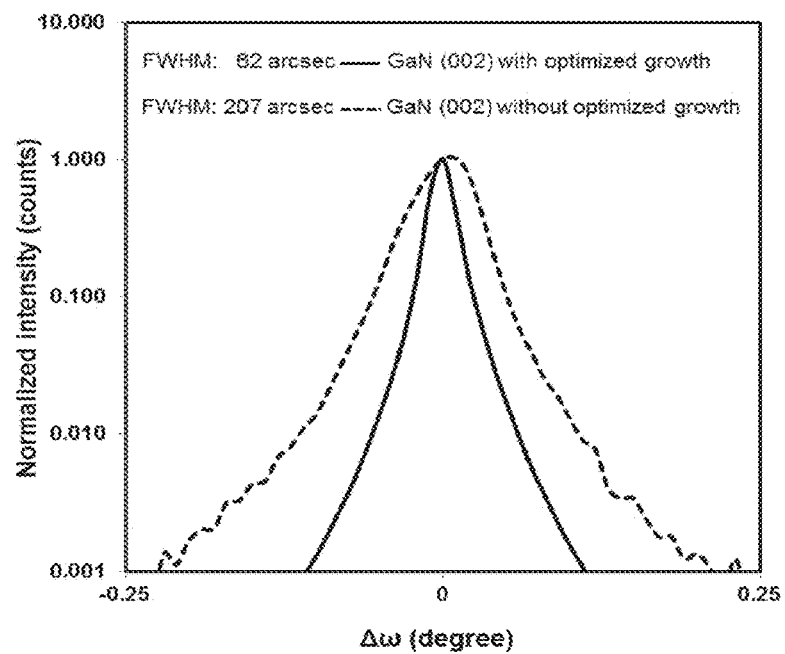

Finally, in FIG. 4b the rocking curves of the GaN (002) peak of a GaN layer in a SiC/AlN/GaN device structure grown by the prior art method and by the method disclosed herein is shown. The GaN (002) peak of the reference GaN layer has a FWHM of 207 arcsec, while the GaN (002) peak of the GaN layer produced according to the method described herein has a narrower FWHM of 62 arcsec. Hence, similar to the AlN nucleation layer also the GaN buffer layer indicates improved crystallinity.

The dislocation density of the GaN buffer layer may be $1 \cdot 10^8$ to $7 \times 10^8$ per $cm^2$, as measured by XRD. Typically, the impurity level for GaN may be less than $1 \times 10^{19}$ per $cm^3$.

Figure 5A:
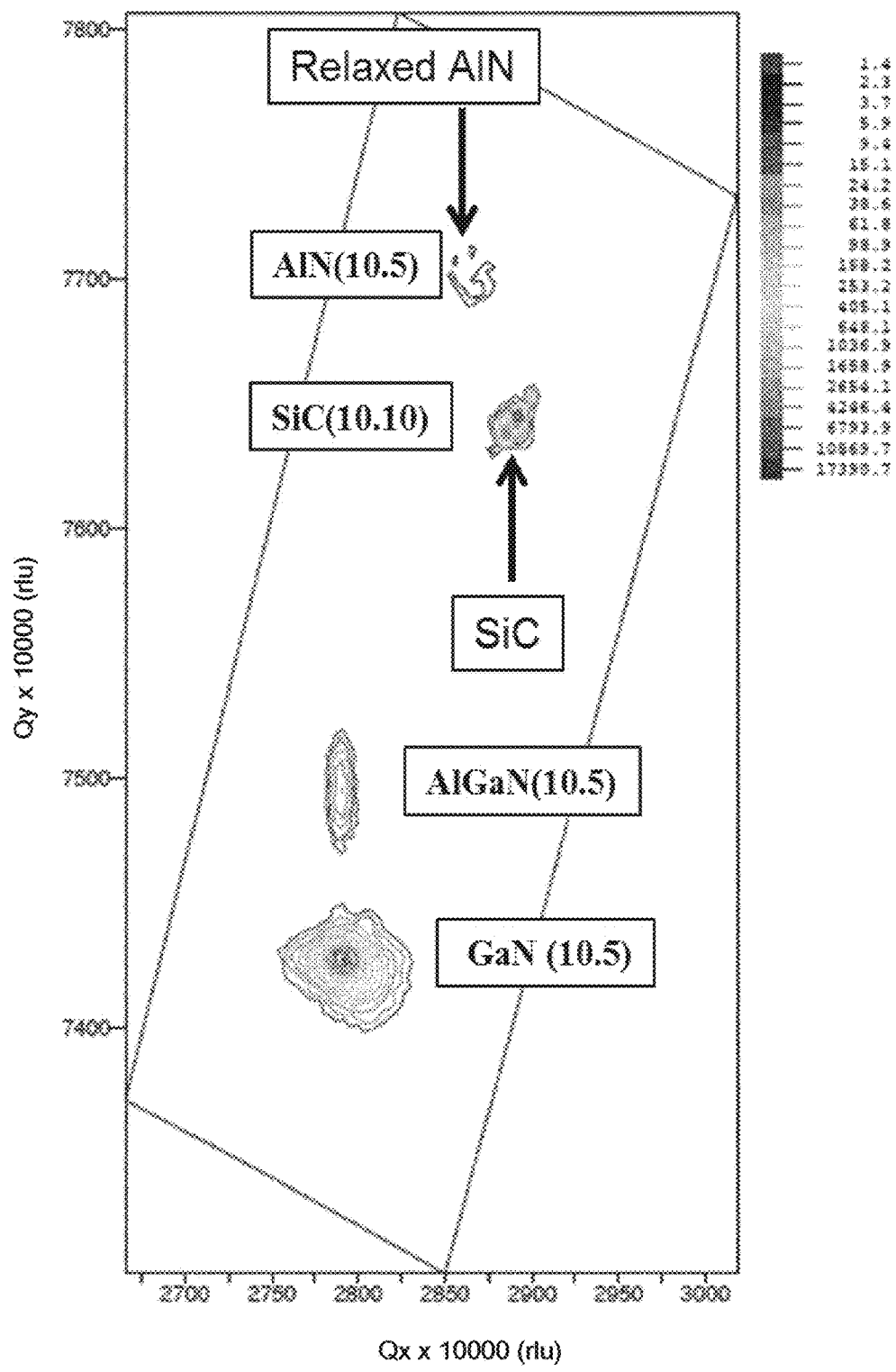
FIGS. 5a and 5b show reciprocal space maps of relaxed AlN and fully strained AlN, respectively, of a high electron mobility transistor (HEMT) device structure, measured by XRD.
Figure 5B:
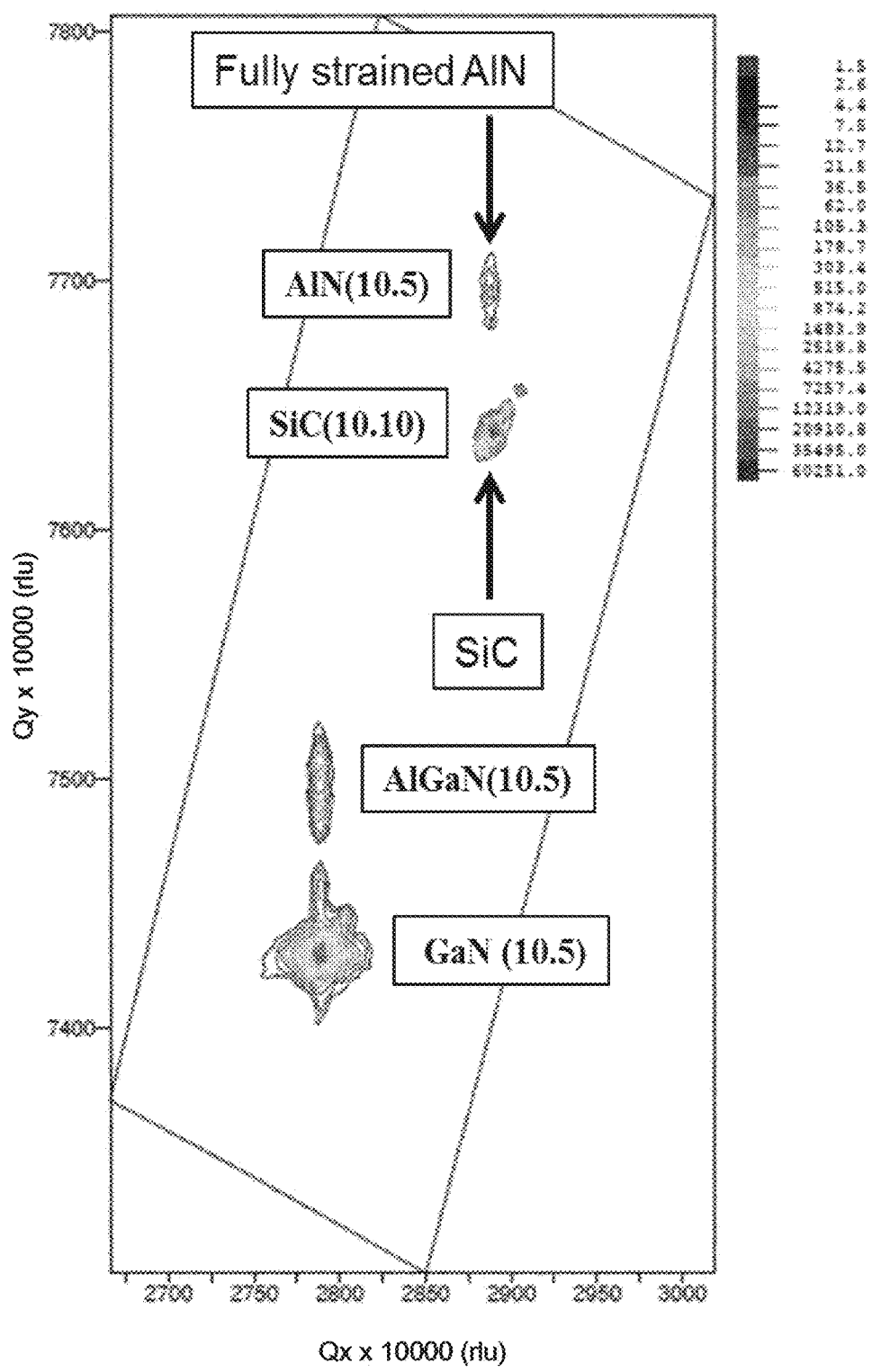

FIGS. 5a and 5b show reciprocal space maps (rlu=reciprocal lattice unit) illustrating relaxed and fully strained AlN, respectively, onto SiC substrates, of a HEMT device structure. The thickness of the AlN nucleation layer (and the GaN buffer layer) is the same as for the layers shown in FIGS. 3a and 3b. As seen in FIG. 5a, the AlN nucleation layer is slightly displaced as compared to SiC as in the x direction. The SiC is located at the same position in FIGS. 5a and 5b due to its relative thick thickness as compared to the AlN nucleation layer. By the use of the method disclosed herein fully strained high crystalline quality AlN nucleation layers may be produced. For fully strained AlN, the AlN should be aligned straight over SiC as seen in FIG. 5b. The other features in FIGS. 5a and 5b illustrate subsequent layers of AlGaN and GaN.

The GaN buffer layers in both FIGS. 5a and 5b are relaxed. However, as discussed above (see FIGS. 4a and 4b), the rocking curves of GaN buffer layers grown according to the method disclosed herein are narrower as compared to the rocking curves of the GaN buffer layers grown according to prior art methods, hence indicating improved crystallinity.

In FIGS. 6a and 6b AFM pictures of AlN nucleation layers produced according to a prior art method and according to the process disclosed herein respectively, are shown. The thicknesses of those layers are the same as for the AlN nucleation layers discussed in connection with FIGS. 3a, 3b, 5a, and 5b. The AlN nucleation layer produced according to prior art, i.e. without pretreatment of the SiC substrate and temperature ramp up upon the growth, shows a lot of pits, i.e. holes and/or recesses in the layer, see FIG. 6a. Typically such AlN nucleation layer may have about 80 to 100 pits per µm. The maximum height of such a pit is the thickness of the AlN nucleation layer and the minimum height is 1 nm. As can be seen in FIG. 6b, the AlN nucleation layer produced according to the process above has much fewer pits and exhibits full coalescence with 0-10 pits per $\mu m^2$, preferably about 0-5 pits per $\mu m^2$.

Experimental Details

X-ray photoelectron spectroscopy (XPS) characterization of pretreated SiC substrates were performed at beamline I311 at the MAX national synchrotron laboratory. High energy resolution of less than 100 and 300 meV at photon energy of 140 and 750 eV, respectively, were utilized to collect the surface core levels spectra.

For the X-ray Diffraction (XRD) characterization a high-resolution X-ray diffractometer (Philips X'Pert MRD) with $\lambda=0.15406$ nm of Cu $K_{\alpha 1}$ radiation was employed to characterize the crystalline quality of the AlN and GaN epitaxial layers. The HR-XRD system is equipped with a hybrid mirror and a triple-axis crystal as the primary and secondary optics, respectively, in which a resolution of ~0.003° (~11 arcsec) can be achieved.

For AlN, the full width half maximum (FWHM) of the rocking curves of the AlN (002) and (105) peaks were measured in the symmetric and the asymmetric diffraction geometry. For GaN, the FWHM of the rocking curves of the GaN (002) and (102) peaks were measured in the symmetric and the skew diffraction geometry.

The surface morphology of AlN epilayers on SiC substrates was characterized by Atomic Force Microscopy (AFM). An AFM system (Vecco Dimension 3100) was employed at tapping mode. The system permits the spatial resolution 0.3~1 Å along the vertical direction and 1~5 nm along the lateral direction, the resolutions of which are limited by the system background noise and the tip radius of curvature of 5~10 nm used in this study, respectively.

Characterization by XRD, XPS and AFM were performed ex situ.

The invention claimed is:

1. A semiconductor device structure comprising:
   a SiC substrate,
   an $In_{x1}Al_{y1}Ga_{1-x1-y1}N$ buffer layer, wherein x1=0-1, y1=0-1 and x1+y1=1, preferably x1<0.05 and y1<0.50, more preferably x1<0.03 and y1<0.30 and most preferably x1<0.01 and y1<0.10, and
   an $In_{x2}Al_{y2}Ga_{1-x2-y2}N$ nucleation layer, wherein x2=0-1, y2=0-1 and x2+y2=1, preferably x2<0.05 and y2>0.50, more preferably x2<0.03 and y2>0.70 and most preferably x2<0.01 and y2>0.90, sandwiched between the SiC substrate and the buffer layer,
   wherein
   the buffer layer has a thickness of 1 to 4 µm, preferably 1.3 to 3 µm and most preferably 1.5 to 2 µm,
   the nucleation layer has a thickness of 10-100 nm, preferably 10-50 nm and most preferably 10-40 nm,
   the buffer layer presents a rocking curve with a (102) peak having a FWHM below 250 arcsec, and
   the nucleation layer presents a rocking curve with a (105) peak having a FWHM below 200 arcsec, as determined by X-ray Diffraction (XRD).

2. The semiconductor device structure according to claim 1, wherein the buffer layer is GaN.

3. The semiconductor device structure according to claim 1, wherein the nucleation layer is AlN.

4. The semiconductor device structure according to claim 1, wherein the SiC polytype is 4H, 6H, or 3C.

5. The semiconductor device structure according to claim 1, wherein the surface of the SiC has less than 5% oxygen monolayer, as determined by X-ray Photoelectron Spectroscopy.

6. The semiconductor device structure according to claim 1, wherein the morphology of the nucleation layer has a full coalescence with 0 to 10 pits per $\mu m^2$, preferably 0 to 8 pits per $\mu m^2$, most preferably 0 to 5 pits per $\mu m^2$.

7. The semiconductor device structure according to according to claim 1, wherein the nucleation layer is fully strained at a thickness of up to at least 100 nm, wherein an in-plane lattice constant of the nucleation layer is exactly the same, or exactly the same +/−0.15%, preferably +/−0.05% or +/−0.02%, as an in-plane lattice constant of the SiC substrate.

8. A semiconductor device formed from the semiconductor device structure according to claim 1.

9. A high electron mobility transistor comprising the semiconductor device structure according to claim 1.

10. A method of producing the semiconductor device structure according to claim 1, comprising:
    providing the SiC substrate, and
    providing the $In_{x2}Al_{y2}Ga_{1-x2-y2}N$ nucleation layer, wherein x2=0-1, y2=0-1, preferably x2<0.05 and y2>0.50, more preferably x2<0.03 and y2>0.70 and most preferably x2<0.01 and y2>0.90, and x2+y2=1, on the SiC substrate,
    providing the $In_{x1}Al_{y1}Ga_{1-x1-y1}N$ buffer layer, wherein x1=0-1, y1=0-1 and x1+y1=1, preferably x1<0.05 and y1<0.50, more preferably x1<0.03 and y1<0.30 and most preferably x1<0.01 and y1<0.10, wherein the pressure upon growth of the nucleation layer and of the buffer layer is 200 mbar to 10 mbar, preferably 100 mbar to 20 mbar, most preferably 60 mbar to 40 mbar, the starting temperature upon growth of the nucleation layer is 800° C. to 1150° C., preferably of 900° C.–1100° C., most preferably of 950° C.–1050° C., and the temperature upon growth of the nucleation layer is 800° C. to 1150° C., preferably of 900° C.–1100° C., most preferably of 950° C.–1050° C., and the nucleation layer and the buffer layer is grown by Metal Organic Chemical Vapor Deposition (MOCVD) or Metal Organic Vapor Phase Epitaxy (MOVPE), wherein the temperature upon growth of the nucleation layer is ramped up by 5-25° C./min, preferably by 7-20° C./min and most preferably by 10-15° C./min, for a time period of 2 min to 20 min, the buffer layer is provided to a thickness of 1 to 4 μm, preferably 1.3 to 3 μm and most preferably 1.5 to 2 μm, the nucleation layer is provided to a thickness of 10-100 nm, preferably 10-50 nm and most preferably 10-40 nm.

11. The method as claimed in claim 10, wherein the substrate is pretreated in situ or ex situ by an etching gas.

12. The method as claimed in claim 11, wherein the etching gas comprises $H_2$, HCl, HF, HBr or $SiF_4$, $Cl_2$, or a combination of $H_2$ and any one of the other.

13. The method as claimed in claim 11, wherein the pressure is 100 mbar to 10 mbar upon pretreatment at a temperature of at least 1250° C., or wherein the pressure is 1000 mbar to 10 mbar upon pretreatment at a temperature of at least 1400° C.

14. The method as claimed in claim 11, wherein the etching gas comprises $H_2$, provided at a flow rate of 20 to 30 l/min and/or HCl provided at a flow rate of 100 to 200 ml/min.

15. The method as claimed in claim 10, wherein the at least one of the precursors for nucleation growth by MOCVD or MOVPE, is metal-organic comprising $Al_2(CH_3)_6$, and the other one is $NH_3$, said precursors being provided by at least one carrier gas comprising Ar, $H_2$ or $N_2$.

16. The method as claimed in claim 10, wherein the growth rate of the nucleation layer is 100 nm/h to 1000 nm/h.

* * * * *